(12) United States Patent
Bonham et al.

(10) Patent No.: US 12,584,240 B2
(45) Date of Patent: Mar. 24, 2026

(54) LOW MASS SUBSTRATE SUPPORT

(71) Applicant: Applied Materials, Inc., Santa Clara, CA (US)

(72) Inventors: Shawn Joseph Bonham, Mesa, AZ (US); Xinning Luan, Tempe, AZ (US); Hui Chen, Tempe, AZ (US); James M. Amos, Apache Junction, AZ (US); John Newman, Chandler, AZ (US); Kirk Allen Fisher, Tempe, AZ (US); Aimee S. Erhardt, Tempe, AZ (US); Philip Michael Amos, Apache Junction, AZ (US); Zhiyuan Ye, San Jose, CA (US); Shu-Kwan Lau, Sunnyvale, CA (US); Lori D. Washington, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 756 days.

(21) Appl. No.: 17/731,414

(22) Filed: Apr. 28, 2022

(65) Prior Publication Data

US 2022/0364263 A1 Nov. 17, 2022

Related U.S. Application Data

(60) Provisional application No. 63/187,787, filed on May 12, 2021.

(51) Int. Cl.
*C23C 16/458* (2006.01)
*C30B 25/12* (2006.01)
(52) U.S. Cl.
CPC .......... *C30B 25/12* (2013.01); *C23C 16/4583* (2013.01)

(58) Field of Classification Search
CPC ................ C30B 25/12; C23C 16/4583; C23C 16/45508; C23C 16/4558; C23C 16/4586;
(Continued)

(56) References Cited

U.S. PATENT DOCUMENTS 5,044,943 A * 9/1991 Bowman ............. C23C 16/4584
118/500
7,615,116 B2 11/2009 Kanaya et al.
(Continued)

FOREIGN PATENT DOCUMENTS

EP 0634785 A1 1/1995
JP 2000026192 A 1/2000
(Continued)

OTHER PUBLICATIONS

English translation of JP 2005-260095.*
(Continued)

*Primary Examiner* — Aiden Lee
(74) *Attorney, Agent, or Firm* — Patterson + Sheridan, LLP

(57) ABSTRACT

Systems and apparatus for a reduced mass substrate support are disclosed, according to certain embodiments. A front side pocket is provided for support of a substrate, while a backside pocket is provided that reduces the mass of the substrate support. By providing the backside pocket, the mass of the overall substrate support is reduced, providing faster thermal cycling times for the substrate support and reducing the weight of the substrate support for transport. Lift pin systems, according to disclosed embodiments, are compatible with existing pedestal systems by providing a hollow extension from each lift pin hole that extends from a bottom of the backside pocket to provide support for lift pin insertion and operation.

20 Claims, 6 Drawing Sheets

(58) Field of Classification Search
    CPC ............... C23C 16/46; C23C 16/4584; H01L
                    21/67115; H01L 21/68735; H01L
                    21/68742; H01L 21/68785; H01L 21/6719
    USPC ................................................ 118/728–729
    See application file for complete search history.

(56)                 References Cited

U.S. PATENT DOCUMENTS

| | | | |
|---|---|---|---|
| 10,269,614 B2 | 4/2019 | Chu et al. | |
| 2002/0043337 A1 | 4/2002 | Goodman et al. | |
| 2012/0074081 A1 | 3/2012 | Gilmore et al. | |
| 2014/0290573 A1* | 10/2014 | Okabe | C23C 16/4584 |
| | | | 118/500 |
| 2016/0281261 A1* | 9/2016 | Oki | H01L 21/68735 |
| 2016/0340799 A1* | 11/2016 | Pitney | C23C 16/4584 |
| 2020/0127163 A1* | 4/2020 | Fujikura | H01L 21/0254 |

FOREIGN PATENT DOCUMENTS

| | | | |
|---|---|---|---|
| JP | 2002146540 A | | 5/2002 |
| JP | 2005260095 A | * | 9/2005 |
| JP | 2015076457 A | | 4/2015 |
| KR | 10-2003-0086220 A | | 11/2003 |
| KR | 10-2012-0079317 A | | 7/2012 |
| KR | 10-2013-0035040 A | | 4/2013 |
| KR | 10-2014-0090809 A | | 7/2014 |
| KR | 102600229 B1 | | 11/2023 |
| WO | 199708743 A1 | | 3/1997 |

OTHER PUBLICATIONS

PCT/US2022/026794, International Search Report and Written Opinion dated Aug. 18, 2022, 11 pages.
Japanese Patent Application No. 2023-569826, Office Action dated Jan. 7, 2025, 7 pages.
Korean Patent Application No. 10-2023-7042415, Office Action dated Nov. 14, 2024, 11 pages.
European Office Action dated Apr. 7, 2025 for Application No. 22808040.4.
Taiwanese Office Action for Application No. 111116565 mailed Sep. 17, 2025.
Office Action from South Korean Patent Application No. 10-2025-7031202 dated Feb. 11, 2026.

* cited by examiner

LOW MASS SUBSTRATE SUPPORT

CROSS-REFERENCE TO RELATED APPLICATIONS

This application claims benefit of U.S. Provisional Patent Application No. 63/187,787, filed May 12, 2021, which is herein incorporated by reference in its entirety.

BACKGROUND

Field

Embodiments of the present disclosure generally relate to substrate processing tools and, more specifically, a substrate support for a substrate processing tool.

Description of the Related Art

Conventionally, existing substrate supports may have a high thermal mass that may increase process energy and response time, reduce process uniformity.

What is needed are systems and apparatus for overcoming the deficiencies of prior approaches.

SUMMARY

Disclosed embodiments relate to a substrate support, that includes a disk-shaped body having a thickness t at an outer edge thereof, and a center located at an axial centerline of the disk-shaped body, a ring coupled to and circumscribing the disk-shaped body, and a front side pocket defined by a front surface of the disk-shaped body and a first radially-inward edge of the ring extending beyond the front surface of the disk-shaped body. The substrate support further includes a backside pocket defined by a backside of the disk-shaped body and a second radially-inward edge of the ring extending beyond the backside of the disk-shaped body, a plurality of lift pin openings extending through the disk-shaped and positioned a at a first radial distance from the center of the disk-shaped body, and a plurality of slots positioned on the backside at a second radial distance from the center of the disk-shaped body, the second radial distance being greater than the first radial distance.

A substrate support is disclosed that includes a disk-shaped body, that includes a first surface having a first raised circular ring disposed about a circumference and defining a first side pocket, the first raised circular ring having a first radial width, and a second surface opposite the first surface on the disk-shaped body having a second raised circular ring disposed about the circumference and defining a second side pocket, the second raised circular ring having a second radial width. The substrate support further includes a plurality of lift pin openings formed through the disk-shaped body and positioned a first distance from a center of the disk-shaped body, and a plurality of slots positioned on the second surface, the plurality of slots being radially aligned with the lift pin openings and positioned at a second distance from the disk-shaped body less than the circumference and greater than the first distance.

A processing chamber is disclosed that includes an upper window and a lower window defining a process volume, and a substrate support disposed within the processing volume. According to certain embodiments the substrate support includes a disk-shaped body having a thickness t at an outer edge thereof and a center located at an axial centerline of the disk-shaped body, a ring coupled to and circumscribing the disk-shaped body, and a front side pocket defined by a front surface of the disk-shaped body and a first radially-inward edge of the ring extending beyond the front surface of the disk-shaped body. The substrate support further includes a backside pocket defined by a backside of the disk-shaped body and a second radially-inward edge of the ring extending beyond the backside of the disk-shaped body, a plurality of lift pin openings extending through the disk-shaped and positioned at a first radial distance from the center of the disk-shaped body, and a plurality of slots positioned on the backside at a second radial distance from the center of the disk-shaped body, the second radial distance being greater than the first radial distance.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure.

Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Disclosed are systems and apparatus for a reduced mass substrate support, according to certain embodiments. A front side pocket is provided for support of a substrate, while a backside pocket is provided that reduces the mass of the substrate support. By providing the backside pocket, the mass of the overall substrate support is reduced, providing faster thermal cycling times for the substrate support and reducing the weight of the substrate support for transport. Lift pin systems, according to disclosed embodiments, are compatible with existing pedestal systems by providing a hollow extension from each lift pin hole or opening that extends from a bottom of the backside pocket to provide support for lift pin insertion and operation.

Figure 1:
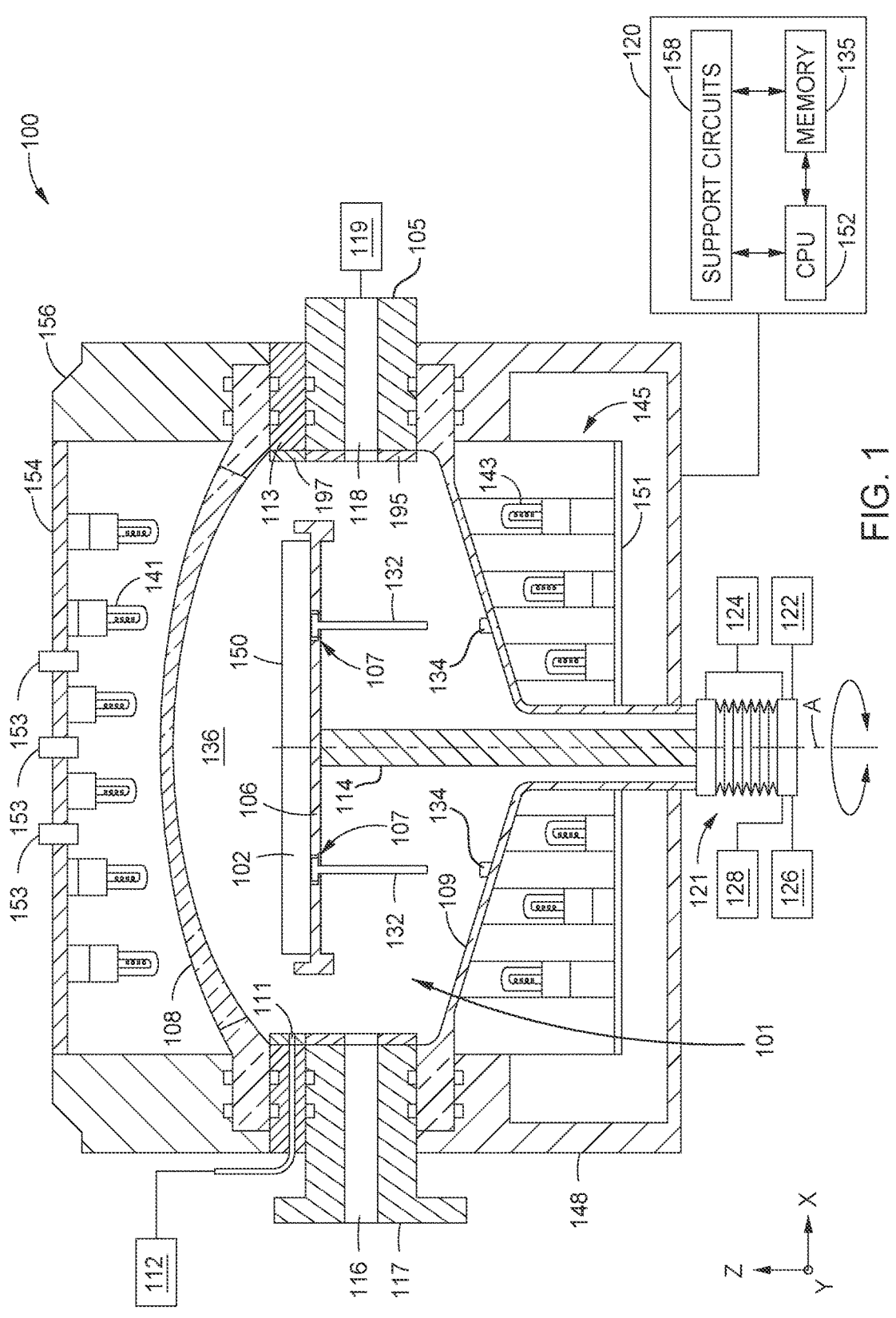
FIG. 1 is a schematic sectional view of a deposition chamber, also disclosed as a processing chamber herein, according to embodiments.

Referring to FIG. 1, a schematic illustration of a deposition chamber 100, also disclosed as a processing chamber herein, is shown according to embodiments of the present disclosure. The deposition chamber 100 is an epitaxial deposition chamber and may be used within a cluster tool (not shown). The deposition chamber 100 is utilized to grow an epitaxial film on a substrate, such as substrate 102. The deposition chamber 100 creates a cross-flow of precursors across the top surface 150 of the substrate 102.

The deposition chamber 100 includes an upper body 156, a lower body 148 disposed below the upper body 156, and a chamber body assembly 105 disposed between the upper body 156 and the lower body 148. The upper body 156, the chamber body assembly 105, and the lower body 148 form a chamber 101. Disposed within the chamber 101 is a substrate support 106, an upper window 108, a lower window 109, a plurality of upper lamps 141, and a plurality of lower lamps 143. As shown, a controller 120 is in communication with the deposition chamber 100 and is used to control processes, such as those described herein. The controller 120 includes a central processing unit (CPU) 152, a memory device 135, and support circuits 158. A substrate support 106 may be a disk-shaped body, and is disposed between the upper window (e.g., dome) 108 and the lower window (e.g., dome) 109. A plurality of upper lamps 141 is disposed between the upper window 108 and a lid 154. The lid 154 includes a plurality of sensors 153 disposed therein for measuring the temperature of the substrate 102. A plurality of lower lamps 143 (one is labeled) are disposed between the lower window 109 within a lamp housing 151. The plurality of lower lamps 143 form a lower lamp assembly 145.

A processing volume 136 is formed between the upper window 108 and the lower window 109. The processing volume 136 has the substrate support 106 disposed therein. The substrate support 106 includes a top surface on which substrate 102 is disposed. The substrate support 106 is attached to a shaft 114. Shaft 114 is connected to a motion assembly 121. The motion assembly 121 includes one or more actuators and/or adjustment devices that provide movement and/or adjustment of the shaft 114 and/or the substrate support 106 within the processing volume 136. The motion assembly 121 includes a rotary actuator 122 that rotates the shaft 114 and/or the substrate support 106 about a longitudinal axis A (e.g., a central vertical axis) of the deposition chamber 100. The motion assembly 121 further includes a vertical actuator 124 to lift and lower the substrate support 106 in the z-direction. The motion assembly 121 includes a tilt adjustment device 126 that is used to adjust the planar orientation of the substrate support 106 and a lateral adjustment device 128 that is used to adjust the position of the shaft 114 and the substrate support 106 side to side within the processing volume 136.

The substrate support 106 may include lift pin holes 107 disposed therein, which may also be referred to as a lift pin opening. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a processing position to a transfer position.

The chamber body assembly 105, as shown herein, is a segmented chamber body assembly. The chamber body assembly 105 includes a base plate and an inject ring. The base plate includes a base body 117, a substrate transfer passage 116, and one or more exhaust passages 118 disposed therethrough. The substrate transfer passage 116 is sized to enable a substrate and a robot arm to pass therethrough. In some embodiments, the substrate transfer passage 116 is greater than 206 mm in width, such as greater than 300 mm in width. The one or more exhaust passages 118 are fluidly coupled to the processing volume 136 and an exhaust pump 119. The inject ring is disposed on top of and coupled to the base plate. The inject ring includes an inject body 113, and a plurality of gas inject passages 111. The plurality of gas inject passages 111 are disposed vertically above the substrate transfer passage 116 and across from the one or more exhaust passages 118. The gas inject passages 111 are fluidly connected to a process gas source 112. The plurality of gas inject passages 111 are vertically offset from the one or more exhaust passages 118 as the plurality of gas inject passages 111 are formed through the inject ring, which is disposed on top of the base plate. Therefore, the plurality of gas inject passages 111 are disposed vertically above the one or more exhaust passages 118.

One or both of the base plate and the inject ring may further include a plurality of purge gas inlets (not shown). The plurality of purge gas inlets may be disposed below the plurality of gas inject passages 111, such that the plurality of purge gas inlets are disposed between the plurality of gas inject passages 111 and the substrate transfer passage 116. The plurality of purge gas inlets may alternatively be vertically aligned with the plurality of gas inject passages 111, such that the plurality of purge gas inlets may also be represented by the plurality of gas inject passages 111. The gas inject passages 111 and the purge gas inlets are positioned to flow a gas parallel to the top surface 150 of a substrate 102 disposed within the processing volume 136.

One or more liners 195, 197 are disposed on the inner surface of the chamber body assembly 105 and protect the chamber body assembly 105 from reactive gases used during deposition processes. In some embodiments, a single liner is utilized, and the one or more liners 195, 197 are combined to form a single unit.

Figure 2:
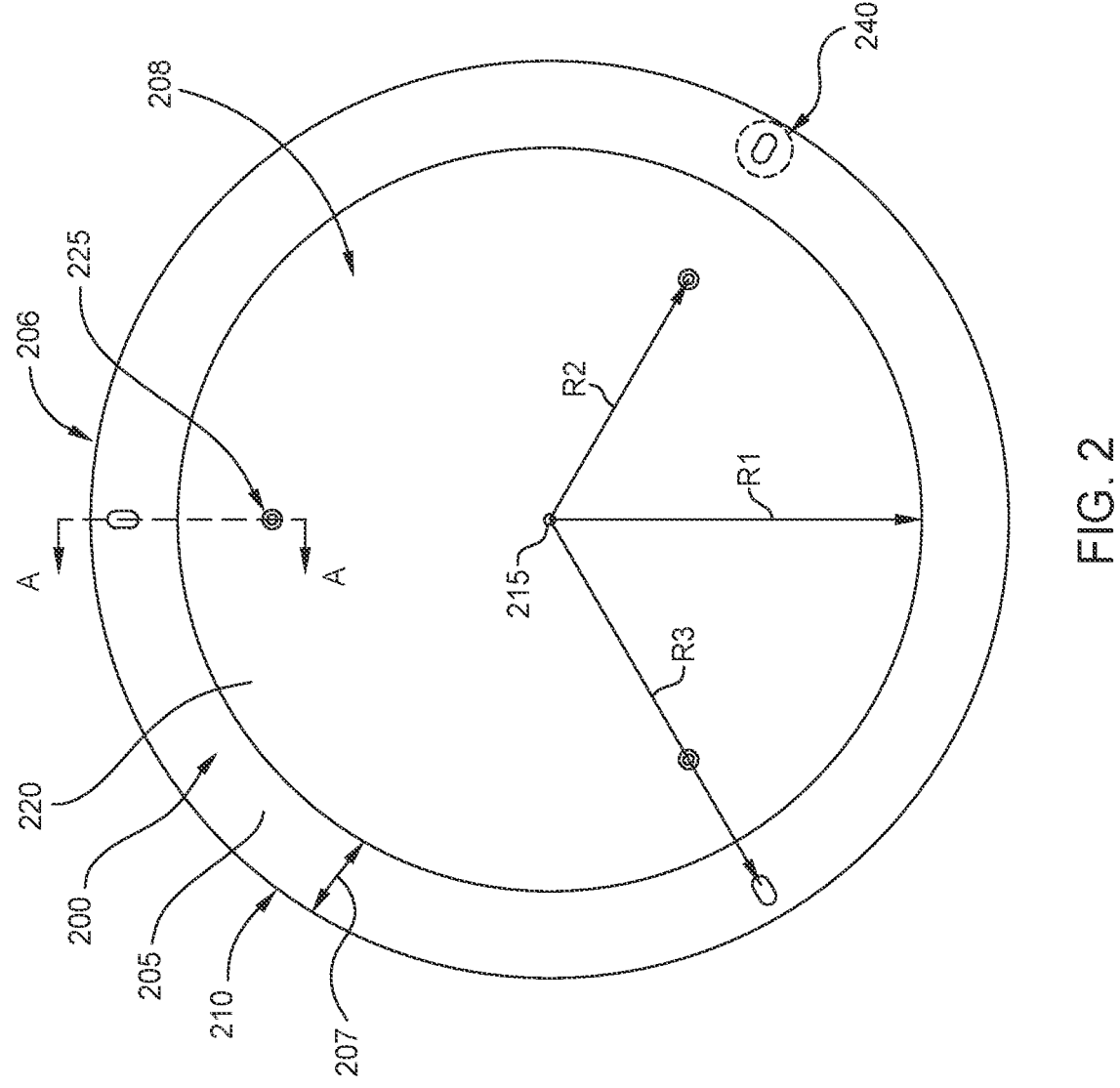
FIG. 2 is a backside (i.e., bottom) view of a substrate support, according to certain embodiments.
Figure 6:
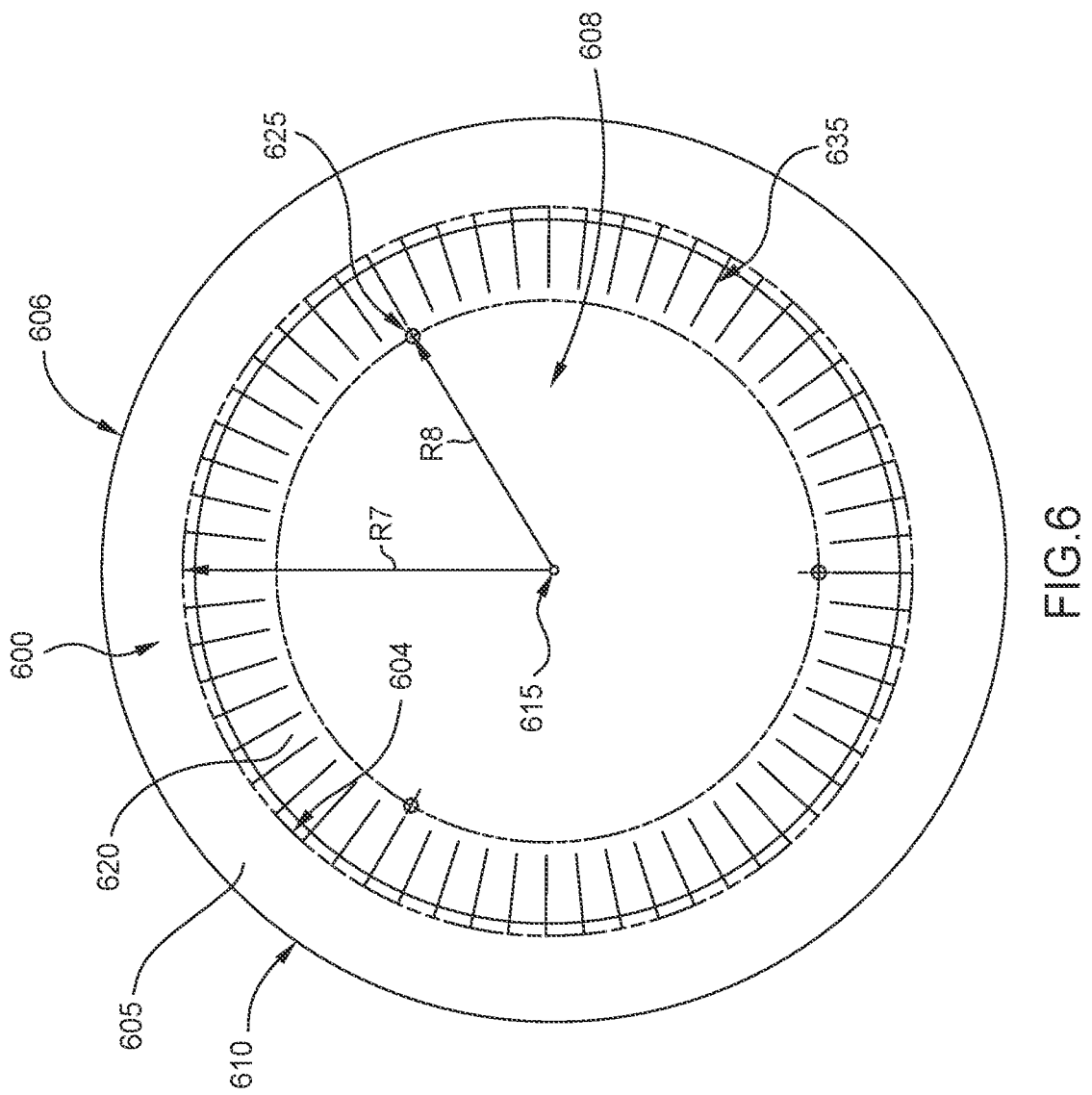
FIG. 6 is a top plan view of a substrate support, according to certain embodiments.

Referring to FIG. 2, a backside 200 of a substrate support 206 is shown according to certain embodiments. The backside 200 of substrate support 206, which may be used in place of substrate support 106, is opposite a front side 600 (as shown in FIG. 6 discussed below) that directly supports a substrate 102 during the operation of a chamber 101 containing the substrate support 206. The substrate support 206 according to certain embodiments includes a disk-shaped body 208 and a ring 205. The backside 200 of the substrate support 206 according to disclosed embodiments has a backside pocket 220. The backside pocket 220 reduces thermal mass of the substrate support 206 to enable rapid thermal cycling and reduce the weight of the substrate support 206. The ring 205 of the backside 200 of substrate support 206 extends radially from the outer edge 210 towards a center 215 of the substrate support 206. According to certain embodiments, a radial width 207, being the difference between in the outer diameter and inner diameter of the ring 205, is between 1 mm and 187 mm. In one embodiment, the radial width 207 may be about 30 mm and 40 mm. The backside pocket 220 extends from the center 215 to a radius R1 of about 153 mm+/−2 mm.

Radially disposed at a radius R2 of about 110 mm and 120 mm from the center 215 may be one or more lift pin holes 225. In the illustrated embodiment, three lift pin holes 225 are shown at equal angular spacing. Radially disposed at a radius R3 of about 180 mm+/−3.0 mm from the center 215 may be one or more slots 240. In the illustrated embodiment, three slots 240 are shown at equal angular spacing. The lift pin holes 225 and slots 240 are discussed in greater detail below.

Figures 3A, 3B, 3C, 3D:
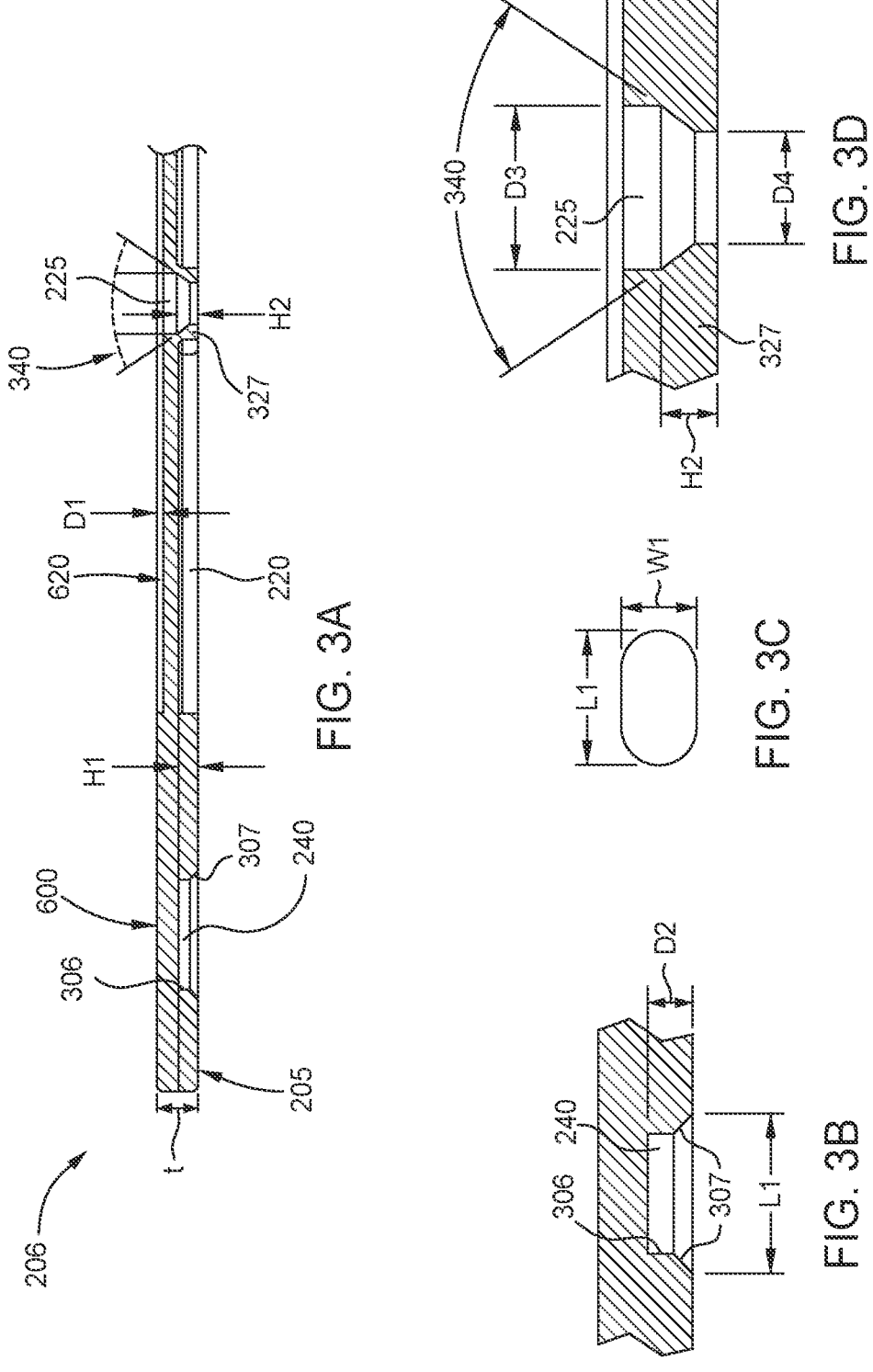
FIG. 3A-3D are partial cross sectional views of the substrate support depicted in FIG. 2, according to certain embodiments.

Referring to FIGS. 3A-3D, a cross section of the substrate support 206 is shown, according to certain embodiments. In FIG. 3A, the ring 205 includes one or more slots 240 that, according to certain embodiments, are elliptical-shaped depressions in the ring 205 to engage with one or more substrate support shafts (not shown in FIG. 1) of the processing chamber to support and align the substrate support 206. A height H1 of the ring 205 may extend about 1.00 mm to about 1.85 mm, such as about 1.78 mm+/−0.02 mm, from the surface of the backside pocket 220 of the substrate support 206. Referring to FIGS. 3A-3C, the slots 240 include a cylindrical base portion 306 with a flared upper portion 307 to facilitate alignment of the substrate support 206 within the chamber 100. The flared upper portion 307 has a chamfer of about 0.5 mm×0.5 mm to about 1.1 mm×1.1 mm. The slots 240 have a depth D2 of about 1.00 mm to about 1.85 mm, such as about 1.78 mm+/−0.02 mm, a length L1 of about 9 mm to 13 mm, and a width W1 of about 4 mm to about 7 mm, according to certain embodiments.

Referring to FIGS. 3A-3D, hollow extension 327 extends from the backside pocket 220 of the substrate support 206 and surrounds each respective lift pin hole 225. According to certain embodiments, the hollow extension 327 may extend a height H2 about 1.78 mm+/−0.02 mm from the backside pocket 220 of the substrate support 206. According to certain embodiments, the portion of the lift pin hole 225 in a front side pocket 620 of the substrate support 206 may have a diameter D3 of about 5 mm to about 6 mm. The portion of the lift pin hole 225 in the backside pocket 220 may have a diameter D4 of about 3.5 mm to about 4.0 mm, as defined by the hollow extension 327. Within the hollow extension 327, the lift pin hole 225 has a transitional taper 340 of about 89° to about 91° configured to retain a head of the lift pin 132 within the lift pin hole 225.

Figure 4:
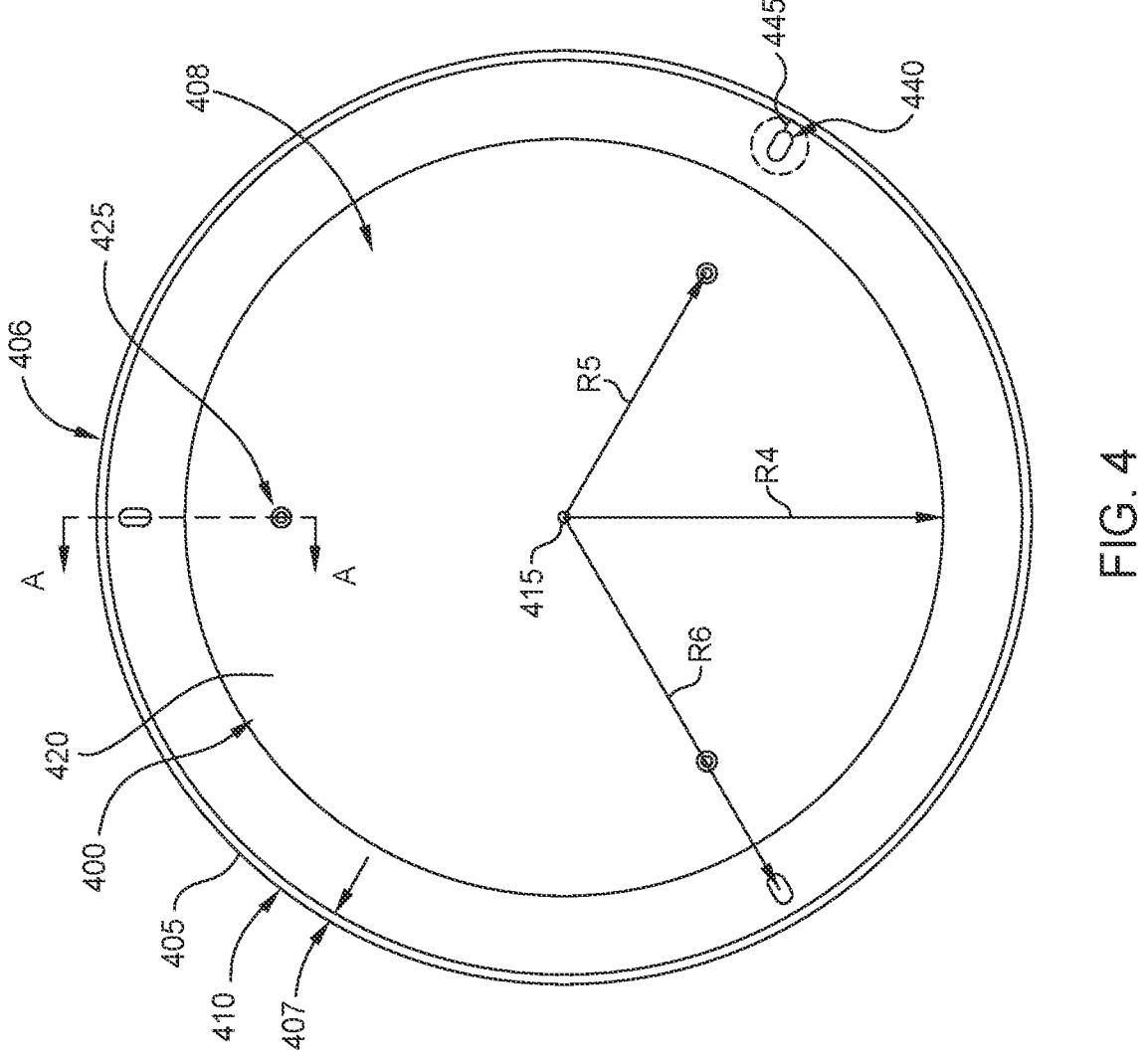
FIG. 4 is a backside view of a substrate support, according to certain embodiments.

Referring to FIG. 4, a backside 400 of a substrate support 406 according to certain embodiments. The backside 400 of the substrate support 406, which may be used in place of substrate support 106, is opposite the front side 600 (discussed below) that directly supports a substrate 102 during the operation of a chamber 101 containing the substrate support 406. The substrate support 406 according to certain embodiments includes a disk-shaped body 408 and a ring 405. The backside 400 of the substrate support 406, according to disclosed embodiments, has a backside pocket 420. The backside pocket 420 reduces the thermal mass of the substrate support 406 to enable rapid thermal cycling and reduce the weight of the substrate support 406. The ring 405 of the backside 400 of the substrate support 406 extends radially from the outer edge 410 towards a center 415 of the substrate support 406. According to certain embodiments, a radial width 407 of the ring 405 is between 1 mm and 187 mm. In one embodiment, the radial width 407 may be about 2 mm to about 5 mm. The backside pocket 420 has a radius R4 of about 153 mm+/−2 mm.

Radially disposed at a radius R5 of about 110 mm to about 120 mm from the center 415 may be one or more lift pin holes 425. In the illustrated embodiment, three lift pin holes 425 are shown at equal angular spacing. Radially disposed at a radius R6 of about 180 mm+/−3.0 mm, from the center 415 may be one or more slots 440. In the illustrated embodiment, three slots 440 are shown at equal angular spacing. According to certain embodiments, the one or more slots 440 are positioned adjacent to the ring 405 and are separated by a gap 445.

Figure 5:
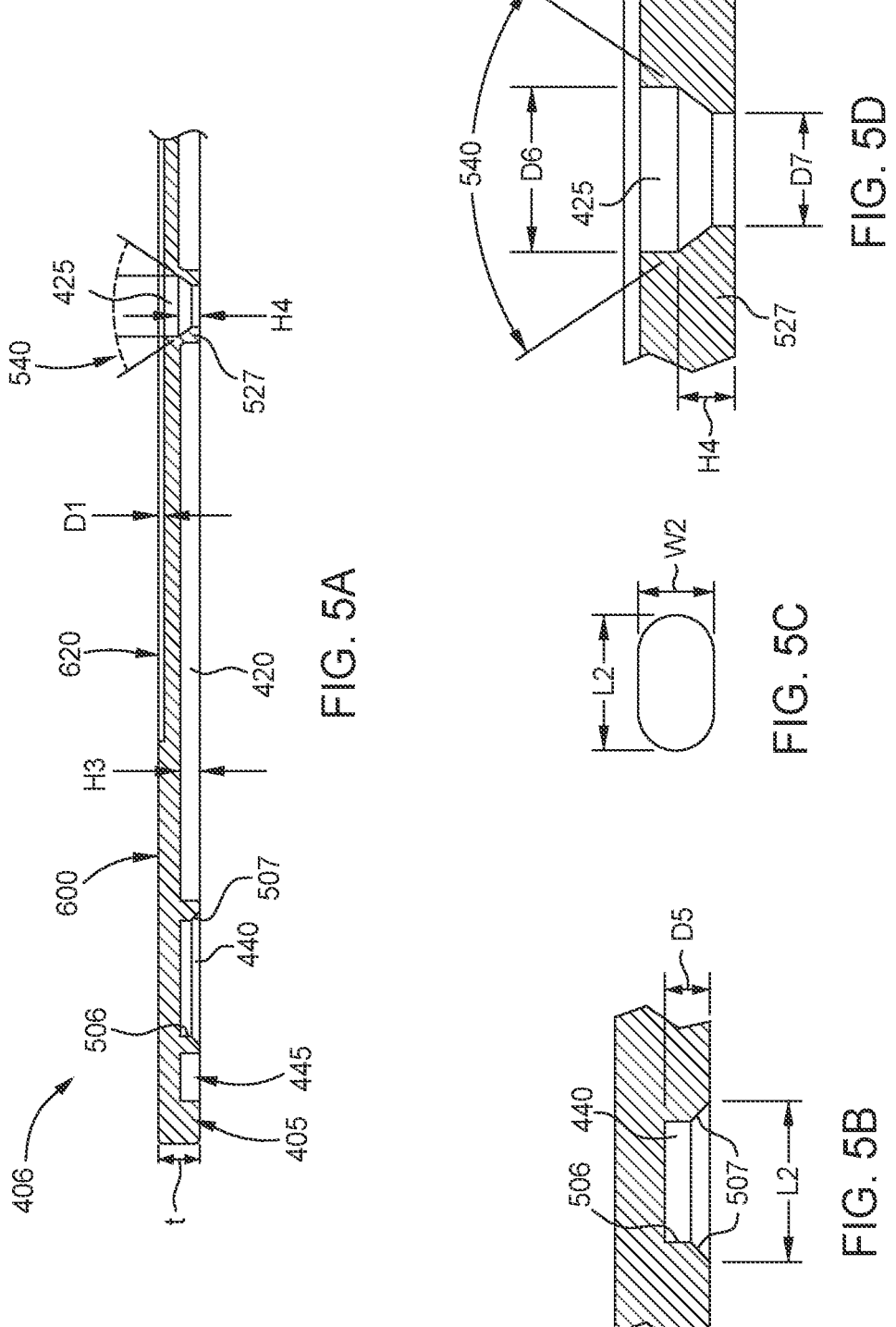
FIG. 5A-5D are partial cross sectional views of the substrate support depicted in FIG. 4, according to certain embodiments.

Referring to FIGS. 5A-5D, a cross-section of the substrate support 406 is shown, according to certain embodiments. The ring 405 is adjacent to one or more slots 440, the ring 405 being separated from the slot 440 by a gap 445. According to certain embodiments, the one or more slots 440 are elliptical-shaped formations in the backside pocket 420 to engage with one or more substrate support shafts (not shown in FIG. 1) of the processing chamber to support and align the substrate support. A height H3 of the ring 405 may extend about 1.00 mm to about 1.85 mm, such as about 1.78 mm+/−0.02 mm, from the surface of the backside pocket 420 of the substrate support 406. Referring to FIGS. 5A-5C, the slots 440 include a cylindrical base portion 506 with a flared upper portion 507 to facilitate alignment of the substrate support 406 within the chamber 100 (shown in FIG. 1). The flared upper portion 507 has a chamfer of about 0.5 mm×0.5 mm to about 1.1 mm×1.1 mm. The slots 440 have a depth D5 of about 1.00 mm to about 1.85 mm, such as about 1.78 mm+/−0.02 mm, a length L2 of about 9 mm to 13 mm, and a width W2 of about 4 mm to about 7 mm, according to certain embodiments.

Referring to FIGS. 5A-5D, the hollow extension 527 extends from the backside pocket 420 of a substrate support 406, and surrounds each respective lift pin hole 425. According to certain embodiments, the hollow extension 527 may extend a height H4 about 1.78 mm+/−0.02 mm from the backside pocket 420 of the substrate support 406. According to certain embodiments, the portion of the lift pin hole 425 in a front side pocket 620 of the substrate support 206 may have a diameter D6 of about 5 mm to about 6 mm. The portion of the lift pin hole 515 in the backside pocket 420 may have a diameter D7 of about 3.5 mm to about 4.0 mm, as defined by the hollow extension 527. Within the hollow extension 527, the lift pin hole has a transitional taper 540 of about 89° to about 91° configured to retain a head of the lift pin 132 within the lift pin hole 225.

Referring to FIG. 6, a front side 600 of a substrate support 606 is shown, according to certain embodiments. Substrate support 606 may be used instead of substrate support 106 of FIG. 1. A backside (not shown) of the substrate support 606 may be the backside 200 of the substrate support 206 of FIG. 2 or the backside 400 of the substrate support 406 of FIG. 4.

The front side 600 of the substrate support 606 includes a ring 605 extending radially inward from an edge 610 toward a center 615. A surface 608 of the front side 600 and a radially inward edge 604 of the ring 605 define the front side pocket 620. While the various substrate supports disclosed herein are described as having disk-like bodies, i.e., rings on the front side 600 thereof and rings on a backside 200 of FIG. 2 or 400 of FIG. 4 thereof, it is to be understood that generally these components form a unitary body. Stated otherwise, the various substrate supports of the present application may alternatively be described as a disk-like body having a ring integrally formed therewith on each of the front and back sides, and extending from the respective front and back sides. In these embodiments, the resulting edge of the substrate support has a thickness t (as shown in FIGS. 3A and 5A), being the combination of ring 605 and one of ring 205 or ring 405, with the combined substrate support thickness t being about 3.7 mm+/−0.2 mm.

The front side pocket 620 may have a radius R7 of about 153 mm+/−2 mm defined by the radially inward edge 604. A depth D1, as shown in FIGS. 3A and 5A, of the front side pocket 620 may be about 1.08 mm+/−0.2 mm. In certain embodiments, the depth at the center 615 of the front side pocket 620 may be about 1.08 mm+/−0.2 mm, while a depth of the front side pocket 620 adjacent to the ring 605 may be about 0.48 mm+/−0.02 mm, forming a slope from the center 615 to the ring 605. In one example, a thickness at the center of the formed substrate support 606 may be about 0.83 mm+/−0.02 mm. In another embodiment, the thickness at the center of the formed substrate support 606 may be about 0.5 mm to about 12.6 mm. According to some embodiments, one or more grooves 635 that perform as vented lines may radially extend from the ring 605 toward the center 615. Each groove 635 has a depth of about 0.9 mm+/−0.5 mm below the surface 608 of the front side pocket 620.

The disk-like body of the substrate support 606 includes one or more lift pin holes 625 formed therein. The lift pin holes 625 are formed at a radius R8 from the center that correspond with lift pin holes 225 of FIG. 2 in connection with backside 200, and with lift pin holes 425 of Figure in connection with backside 400.

By providing a backside pocket according to disclosed embodiments, the mass of disclosed substrate supports may less than that of conventional approaches, reducing time required to thermally cycle the substrate support in addition to reducing overall weight for ease of transport of the substrate support, or the substrate support with a substrate placed in a front side pocket.

While the foregoing is directed to embodiments of the present disclosure, other and further embodiments of the disclosure may be devised without departing from the basic scope thereof, and the scope thereof is determined by the claims that follow.

What is claimed is:

1. A substrate support, comprising:
   a disk-shaped body having a center located at an axial centerline of the disk-shaped body; and
   a frontside ring integrally formed on a frontside of the disk-shaped body;
   a front side pocket defined by the frontside of the disk-shaped body and a first radially-inward edge of the frontside ring, the frontside ring comprising one or more grooves extending in a line from the frontside ring toward the center of the disk-shaped body;
   a backside ring integrally formed on a backside of the disk-shaped body, wherein the frontside ring and the backside ring together have a first thickness;
   a backside pocket defined by the backside of the disk-shaped body and a second radially-inward edge of the backside ring;
   a plurality of lift pin openings extending through the disk-shaped body and positioned at a first radial distance from the center of the disk-shaped body; and a plurality of slots positioned on the backside at a second radial distance from the center of the disk-shaped body, the second radial distance being greater than the first radial distance.

2. The substrate support of claim 1, wherein the front side pocket has a radius of about 151 mm to about 155 mm and a depth of about 1.06 mm to about 1.10 mm at a center of the front side pocket.

3. The substrate support of claim 2, wherein the front side pocket has a depth of about 0.28 mm to about 0.68 mm at an edge of the front side pocket adjacent to the ring.

4. The substrate support of claim 2, wherein the backside pocket has a radius of about 1 mm to about 153 mm.

5. The substrate support of claim 4, wherein the depth of the backside pocket is about 1.0 mm to about 1.80 mm.

6. The substrate support of claim 5, wherein a height of a hollow extension extending from each of the plurality of lift pin openings is about 1.76 mm to about 1.80 mm.

7. The substrate support of claim 1, wherein a thickness of the disk-shaped body at the center thereof is about 0.5 mm to about 12.6 mm.

8. A substrate support, comprising:
   a disk-shaped body, comprising:
   a first surface having a first raised circular ring disposed adjacent to a circumference of an outer edge of the disk-shaped body and defining a first side pocket comprising one or more grooves extending in a line from the first raised circular ring toward a center of the disk-shaped body, the first raised circular ring having a first radial width between the outer edge of the disk-shaped body and a radially-inward edge of the first raised circular ring;
   a second surface opposite the first surface on the disk-shaped body having a second raised circular ring disposed about the circumference of the disk-shaped body and defining a second side pocket, the second raised circular ring having a second radial width between the outer edge of the disk-shaped body and a radially-inward edge of the second raised circular ring;
   a plurality of lift pin openings formed through the disk-shaped body and positioned a first distance from center of the disk-shaped body; and
   a plurality of slots positioned on the second surface, the plurality of slots being radially aligned with the lift pin openings and positioned at a second radial distance from the center of the disk-shaped body, wherein the second radial distance is less than the circumference of the disk-shaped body and greater than the first distance.

9. The substrate support of claim 8, wherein the first side pocket has a radius of about 151 mm to about 155 mm and a depth of about 1.06 mm to about 1.10 mm.

10. The substrate support of claim 9, wherein the first side pocket has a depth of about 0.28 mm to about 0.68 mm at an edge of the first side pocket adjacent to the first raised circular ring.

11. The substrate support of claim 9, wherein the second side pocket has a radius of about 1 mm to about 153 mm.

12. The substrate support of claim 11, wherein the depth of the second side pocket is about 1.76 mm to about 1.80 mm.

13. The substrate support of claim 12, wherein a height of a hollow extension extending from each of the plurality of lift pin openings is about 1.0 mm to about 1.80 mm.

14. The substrate support of claim 8, wherein a thickness about a centerline of the disk-shaped body is about 0.83 mm.

15. A processing chamber comprising:

an upper window and a lower window defining a process volume; and a substrate support disposed within the processing volume, comprising:

a disk-shaped body having a center located at an axial centerline of the disk-shaped body; and a frontside ring integrally formed on a frontside of the disk-shaped body;

a front side pocket defined by the frontside of the disk-shaped body and a first radially-inward edge of the frontside ring, the frontside ring comprising one or more grooves extending in a line from the frontside ring toward the center of the disk-shaped body;

a backside ring integrally formed on a backside of the disk-shaped body, wherein the frontside ring and the backside ring have a first thickness;

a backside pocket defined by the backside of the disk-shaped body and a second radially-inward edge of the ring;

a plurality of lift pin openings extending through the disk-shaped and positioned at a first radial distance from the center of the disk-shaped body; and a plurality of slots positioned on the backside at a second radial distance from the center of the disk-shaped body, the second radial distance being greater than the first radial distance.

16. The processing chamber of claim 15, wherein the front side pocket has a radius of about 151 mm to about 155 mm and a depth of about 1.06 mm to about 1.10 mm at a center of the front side pocket.

17. The processing chamber of claim 16, wherein the front side pocket of the substrate support has a depth of about 0.28 mm to about 0.68 mm at an edge of the front side pocket adjacent to the ring.

18. The processing chamber of claim 16, wherein the backside pocket of the substrate support has a radius of about 1 mm to about 153 mm.

19. The processing chamber of claim 18, wherein the lift pin opening has a diameter of about 3.5 mm to 3.9 mm.

20. The processing chamber of claim 19, wherein a height of a hollow extension extending from each of the plurality of lift pin openings of the substrate support is about 1.76 mm to about 1.80 mm.

\* \* \* \* \*